(12) United States Patent
Simcoe

(10) Patent No.: US 10,978,411 B2
(45) Date of Patent: Apr. 13, 2021

(54) RF POWER PACKAGE HAVING PLANAR TUNING LINES

(71) Applicant: Infineon Technologies AG, Neubiberg (DE)

(72) Inventor: Michael Simcoe, S. San Francisco, CA (US)

(73) Assignee: Infineon Technologies AG, Neubiberg (DE)

(*) Notice: Subject to any disclaimer, the term of this patent is extended or adjusted under 35 U.S.C. 154(b) by 583 days.

(21) Appl. No.: 15/355,498

(22) Filed: Nov. 18, 2016

(65) Prior Publication Data

US 2018/0145043 A1    May 24, 2018

(51) Int. Cl.
*H01L 23/66* (2006.01)
*H01L 23/00* (2006.01)
(Continued)

(52) U.S. Cl.
CPC .......... *H01L 23/66* (2013.01); *H01L 21/4846* (2013.01); *H01L 23/48* (2013.01); *H01L 23/49822* (2013.01); *H01L 23/49838* (2013.01); *H01L 23/49866* (2013.01); *H01L 24/80* (2013.01); *H01L 25/072* (2013.01); *H01L 25/50* (2013.01); *H01P 3/081* (2013.01); *H01P 5/028* (2013.01); *H03F 1/0288* (2013.01); *H03F 3/19* (2013.01); *H03F 3/211* (2013.01); *H03F 3/60* (2013.01); *H01L 22/12* (2013.01); *H01L 22/14* (2013.01); *H01L 22/20* (2013.01); *H01L 23/5389* (2013.01); *H01L 2223/6627* (2013.01);
(Continued)

(58) Field of Classification Search
CPC ................. H01L 23/66; H01P 3/081

USPC ........................................... 333/32
See application file for complete search history.

(56) References Cited

U.S. PATENT DOCUMENTS 5,270,668 A * 12/1993 Ikeda ............... H03F 3/601
330/277
5,446,961 A   9/1995 Levite et al.
(Continued)

FOREIGN PATENT DOCUMENTS

CN        102098008 A     6/2011

OTHER PUBLICATIONS

Seifert; Tobias et al., "Aerosol Jet printing of nano particle based electrical chip interconnects", ScienceDirect, Materials Today: Proceedings 2, 2015, pp. 4262-4271.

*Primary Examiner* — Samuel S Outten
(74) *Attorney, Agent, or Firm* — Murphy, Bilak & Homiller, PLLC

(57) ABSTRACT

An RF power package includes a substrate having a metallized part and an insulating part, an RF power transistor die embedded in or attached to the substrate, the RF power transistor die having a die input terminal, a die output terminal, an input impedance and an output impedance, a package input terminal formed in the metallized part or attached to the insulating part of the substrate, a package output terminal formed in the metallized part or attached to the insulating part of the substrate, and a first plurality of planar tuning lines formed in the metallized part of the substrate and electrically connecting the die output terminal to the package output terminal. The first plurality of planar tuning lines is shaped so as to transform the output impedance at the die output terminal to a higher target level at the package output terminal.

19 Claims, 6 Drawing Sheets

(51) Int. Cl.
| | |
|---|---|
| *H03F 3/60* | (2006.01) |
| *H01L 23/48* | (2006.01) |
| *H01P 5/02* | (2006.01) |
| *H01L 21/48* | (2006.01) |
| *H01L 23/498* | (2006.01) |
| *H01L 25/07* | (2006.01) |
| *H01L 25/00* | (2006.01) |
| *H01P 3/08* | (2006.01) |
| *H03F 1/02* | (2006.01) |
| *H03F 3/19* | (2006.01) |
| *H03F 3/21* | (2006.01) |
| *H01L 21/66* | (2006.01) |
| *H01L 23/538* | (2006.01) |
| *H03H 7/38* | (2006.01) |

(52) U.S. Cl.
CPC ........... *H01L 2223/6655* (2013.01); *H01L 2223/6661* (2013.01); *H03F 2200/222* (2013.01); *H03F 2200/255* (2013.01); *H03F 2200/387* (2013.01); *H03F 2200/423* (2013.01); *H03F 2200/451* (2013.01); *H03F 2203/21103* (2013.01); *H03F 2203/21139* (2013.01); *H03H 7/38* (2013.01)

(56) References Cited

U.S. PATENT DOCUMENTS

| | | | | |
|---|---|---|---|---|
| 5,477,083 | A | * | 12/1995 | Kawai ................... H01L 23/66 257/664 |
| 6,462,423 | B1 | | 10/2002 | Akram et al. |
| 6,639,487 | B1 | * | 10/2003 | Salmela ................. H01P 5/028 333/238 |
| 9,065,391 | B1 | | 6/2015 | Komiak |
| 2012/0025915 | A1 | | 2/2012 | Ui |
| 2012/0193771 | A1 | * | 8/2012 | Masuda .................. H01P 5/12 257/664 |
| 2016/0294340 | A1 | | 10/2016 | Goel et al. |
| 2017/0085228 | A1 | * | 3/2017 | Abdo ................. H01L 23/5223 |

\* cited by examiner

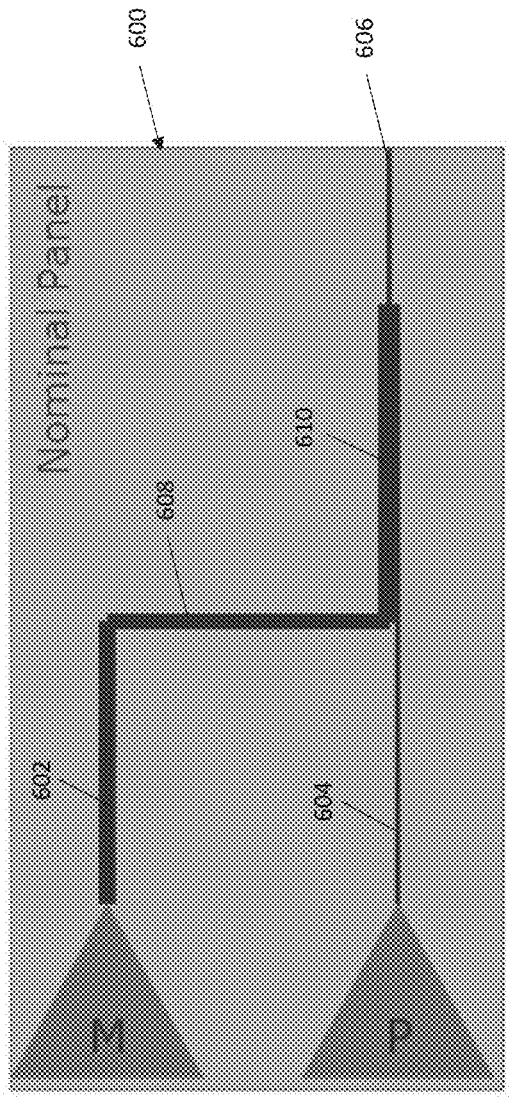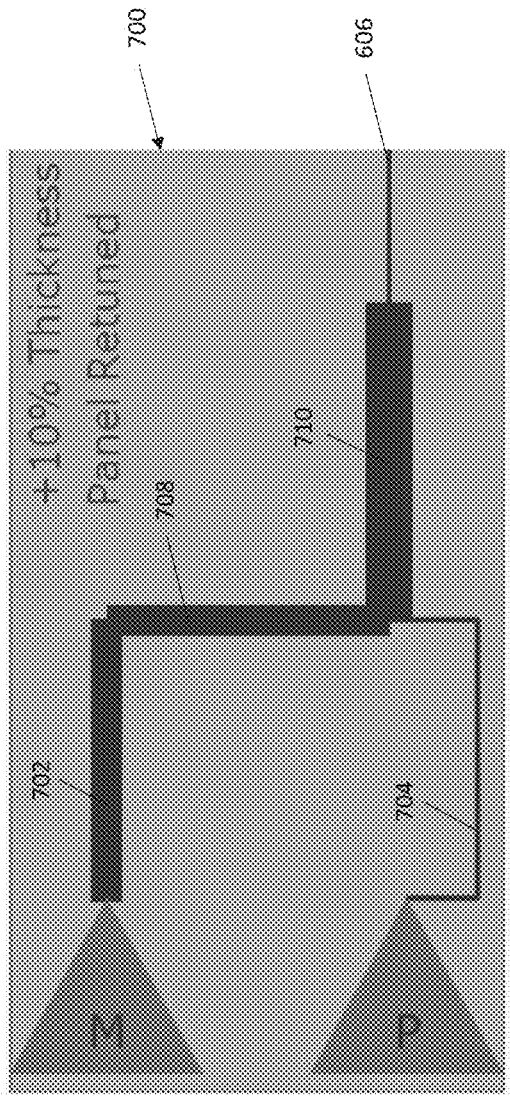
Figure 6A
Figure 6B

US 10,978,411 B2

RF POWER PACKAGE HAVING PLANAR TUNING LINES

FIELD OF TECHNOLOGY

The present application relates to RF-power packages, more particularly to RF-power packages having tuning lines.

BACKGROUND

Impedance matching is needed in RF power packages for moving the very low impedance of the power transistors to higher impedances so as to facilitate customer matching. Wire bonds are conventionally used for impedance matching/transformation, by changing impedances to different levels. Wire bonds are complex and expensive to implement, especially for tight tolerances required for low impedance matching. Wire bonding also requires special precise equipment and assembly procedures. It is difficult and costly to achieve and maintain consistent bonding and hence performance across many parts/wafers, and low-loss wire bond materials like gold are expensive. Hence, there is a need for an alternative impedance matching/transformation solution for RF power packages.

SUMMARY

According to an embodiment of an RF power package, the RF power package comprises a substrate having a metallized part and an insulating part, an RF power transistor die embedded in or attached to the substrate, the RF power transistor die having a die input terminal, a die output terminal, an input impedance and an output impedance, a package input terminal formed in the metallized part or attached to the insulating part of the substrate, a package output terminal formed in the metallized part or attached to the insulating part of the substrate, and a first plurality of planar tuning lines formed in the metallized part of the substrate and electrically connecting the die output terminal to the package output terminal. The first plurality of planar tuning lines is shaped so as to transform the output impedance at the die output terminal to a higher target level at the package output terminal.

According to an embodiment of a method of manufacturing an RF power package, the method comprises: embedding or attaching an RF power transistor die to a substrate having a metallized part and an insulating part, the RF power transistor die having a die input terminal, a die output terminal, an input impedance and an output impedance; and forming a first plurality of planar tuning lines in the metallized part of the substrate, the first plurality of planar tuning lines electrically connecting the die output terminal to a package output terminal formed in the metallized part or attached to the insulating part of the substrate. The first plurality of planar tuning lines is formed by shaping the first plurality of planar tuning lines so that the first plurality of planar tuning lines transforms the output impedance at the die output terminal to a higher target level at the package output terminal.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 6A illustrates a top-down plan view of part of a Doherty amplifier package having a substrate with nominal thickness.

FIG. 6B illustrates a top-down plan view of the same part of another Doherty amplifier package having a substrate with +10% variation in thickness, with retuning.

DETAILED DESCRIPTION

Described next are embodiments of an RF power package in which conventional wire bond-based impedance matching/transformation e.g., for high-power transistors is replaced with planar tuning lines printed in the metallized part of a substrate (carrier). The impedance matching/transformation needed for a particular RF power package is optically defined, which is cheaper to implement and provides better consistency/accuracy compared to wire bonds. Optical line printing techniques are well established, thus eliminating the need for special precise wire bonding equipment and assembly procedures for implementing the desired impedance matching/transformation. Both signal/power routing between packaging components and the desired impedance matching/transformation are implemented by optically defined planar tuning lines.

Figure 1:
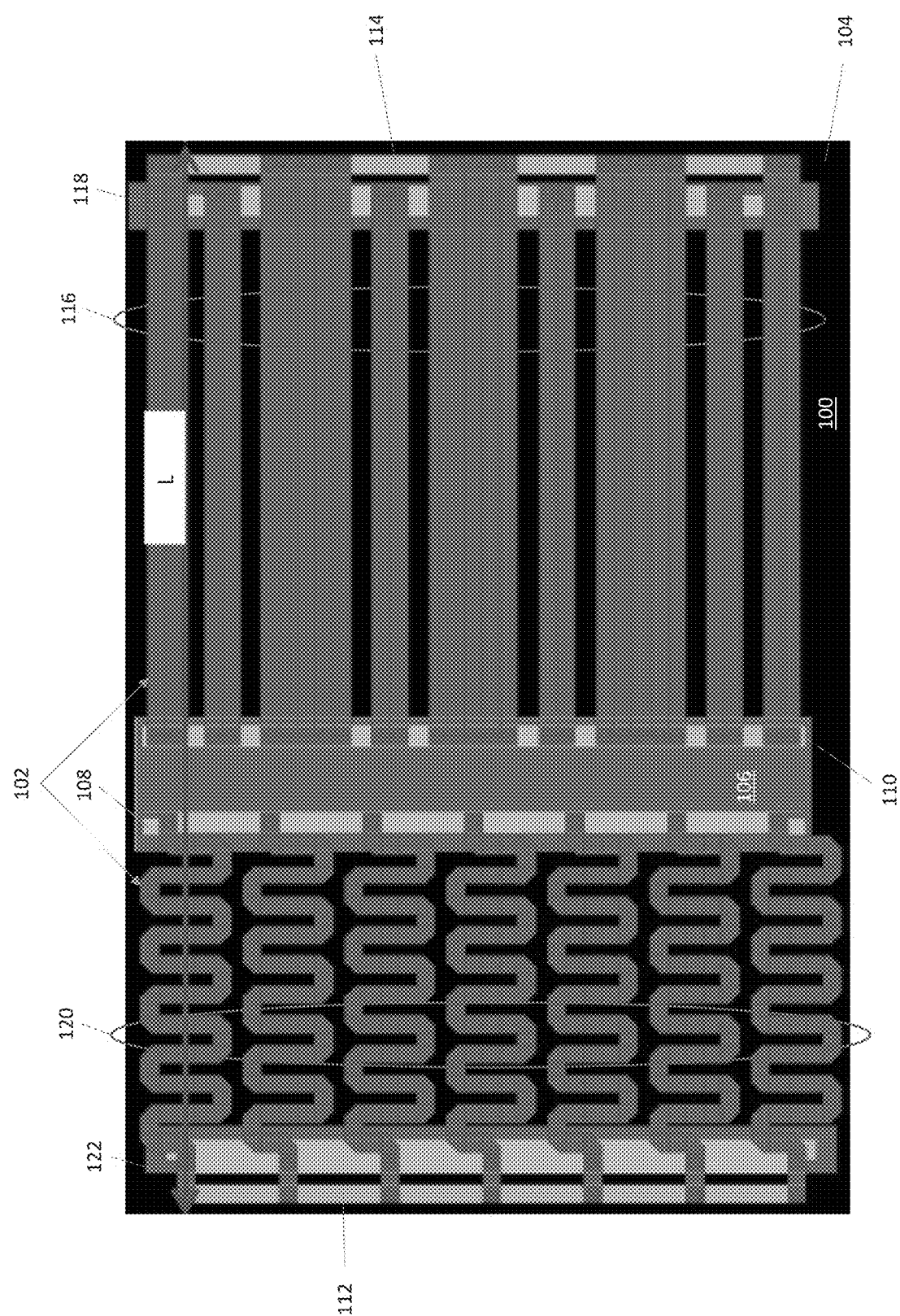
FIG. 1 illustrates a top-down plan view an embodiment of an RF power package.
Figure 2:
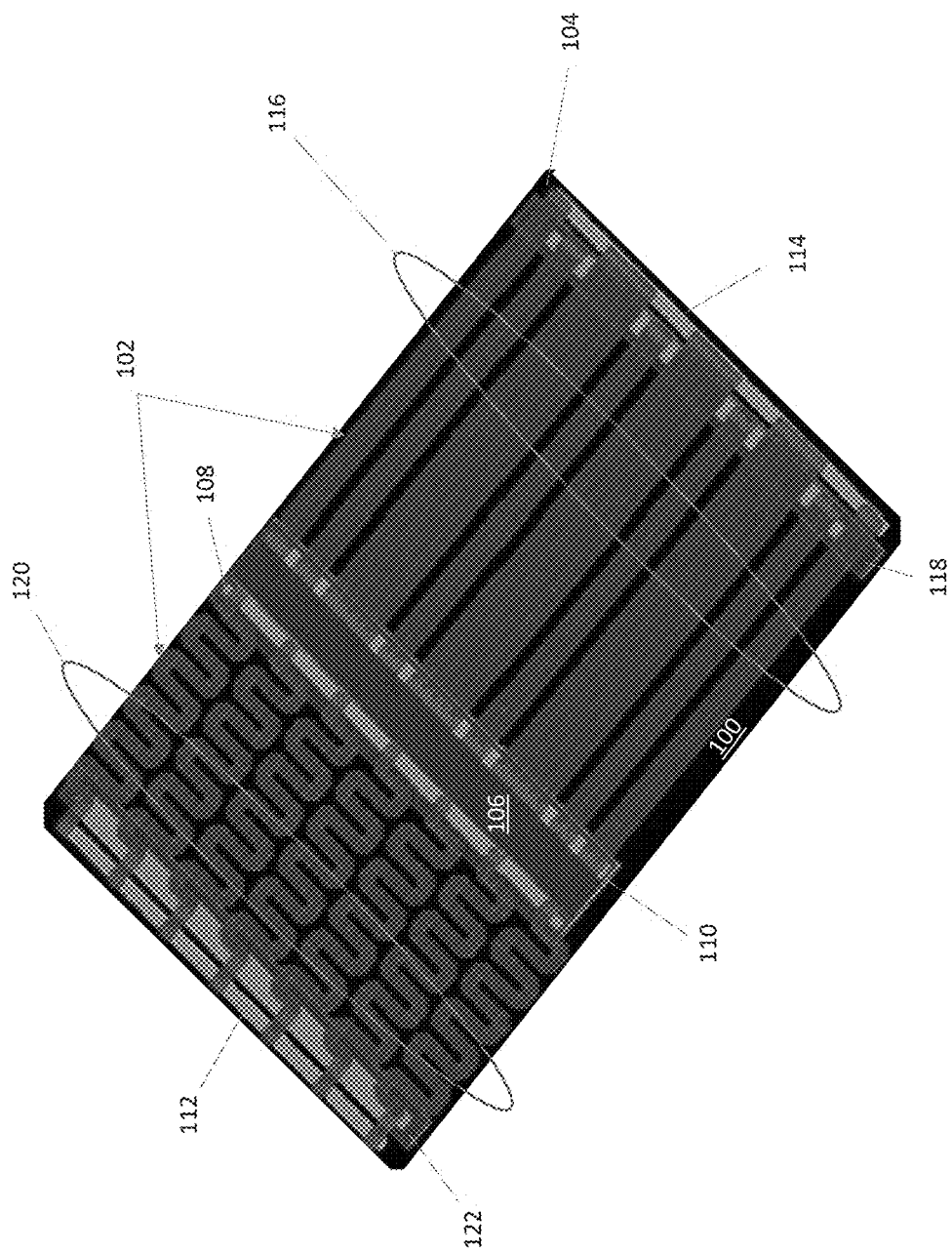
FIG. 2 illustrates a perspective view of the RF power package shown in FIG. 1.

FIG. 1 illustrates a top-down plan view an embodiment of an RF power package, and FIG. 2 illustrates a perspective view of the package. The RF power package comprises a substrate 100 of length L and having a metallized part 102 and an insulating part 104. At least one RF power transistor die 106 is embedded in or attached to the substrate 100. Each RF power transistor die 106 has a die input terminal 108, a die output terminal 110, an input impedance and an output impedance. A package input terminal 112 and a package output terminal 114 are formed in the metallized part 102 or attached to the insulating part 104 of the substrate 100. A first plurality of planar tuning lines 116 are formed in the metallized part 102 of the substrate 100 and electrically connect the die output terminal 110 to the package output terminal 114. The first plurality of planar tuning lines 116 is shaped so as to transform the output impedance at the die output terminal 110 to a higher target level at the package output terminal 114. As such, the first plurality of planar tuning lines 116 provides both signal/power routing between packaging components and impedance matching/transformation.

The first plurality of planar tuning lines 116 is shown in FIGS. 1 and 2 as generally straight lines. This way, the impedance match/transformation on the output side of the RF power package is implemented using straight lines. Meandering lines can increase loss on the output side of the RF power package, but may be suitable in some applications.

SMT (surface mount technology) components such as capacitors, resistors, inductors, etc. can be included in the RF power package for direct in-package impedance matching/transformation. FIGS. 1 and 2 illustrate an output capacitor 118 embedded in or attached to the substrate 100 and electrically connected between the die output terminal 110 and the package output terminal 114. The first plurality of planar tuning lines 116 and the output capacitor 118 form an output impedance matching network of the RF power package.

A second plurality of planar tuning lines 120 formed in the metallized part 102 of the substrate 100 electrically connect the die input terminal 108 to the package input terminal 112. The second plurality of planar tuning lines 120 is shaped so as to transform the input impedance at the die input terminal 108 to a different level at the package input terminal 112. An input capacitor 122 embedded in or attached to the substrate 100 is electrically connected between the die input terminal 108 and the package input terminal 112. The second plurality of planar tuning lines 120 and the input capacitor 122 form an input impedance matching network of the RF power package. In one embodiment, the second plurality of planar tuning lines 120 is formed in meandering lines so as to provide the desired impedance matching/transformation on the input side of the RF power package.

The RF power package design shown in FIGS. 1 and 2 obviates the need for bond wires of different lengths and heights on the input and output sides of the package. Instead, the desired impedance matching/transformation on the input and output sides of the package is provided by the planar meandering tuning lines 116, 118.

The RF power package design shown in FIGS. 1 and 2, in which both signal/power routing and impedance matching/transformation are provided by optically defined planar tuning lines 116, 120, is a cost-effective and flexible package design that can support multiple blocks such as low pass circuit, PA (power amplifier), LNA (low noise amplifier), control, etc. Extended matching can be provided via the planar tuning lines 116, 120 e.g. by extending the matching to second and third capacitors, stepping impedance each time. Additional transmission lines can be implemented by the planar tuning lines 116, 120.

The RF power package configuration can also be used to implement Doherty RF power packages, in which more than one RF power amplifier die is included in the package and the desired impedance matching/transformation and even possibly the Doherty combining network can be implemented using the optically defined printed planar lines 116, 120. The RF power package described herein is well suited for 5G applications, which requires a highly integrated and inexpensive packaging solution as potentially hundreds of front end units may be included per MIMO (multiple-input, multiple-output) base station.

In one embodiment, the substrate 100 of the RF power package comprises a ceramic body and a patterned metallization applied to the ceramic body. The patterned metallization forms the metallized part 102 of the substrate 100 according to this embodiment. For example, the substrate can be a DCB (direct copper bonded) substrate, an AMB (active metal brazed) substrate, a DAB (direct aluminum bonded) substrate, etc.

In another embodiment, the substrate 100 is a printed circuit board (PCB). The PCB has conductive tracks/microstrips/traces patterned into one or more copper sheets laminated onto a non-conductive body. The conductive tracks and the one or more copper sheets form the metallized part 102 of the substrate 100 according to this embodiment.

In yet another embodiment, the substrate 100 is an eWLB (embedded wafer level ball grid array) type substrate that comprises a first insulating material in which the RF power transistor die 106 is embedded, a second insulating material covering the first insulating material and the RF power transistor die 106, and one or more metal redistribution layers disposed in the second insulating material. Each metal redistribution layer is electrically connected to die input terminal 108 and/or die output terminal 110 through openings in the second insulating material. The one or more metal redistribution layers form the metallized part 102 of the substrate 100 according to this embodiment.

Figure 3:
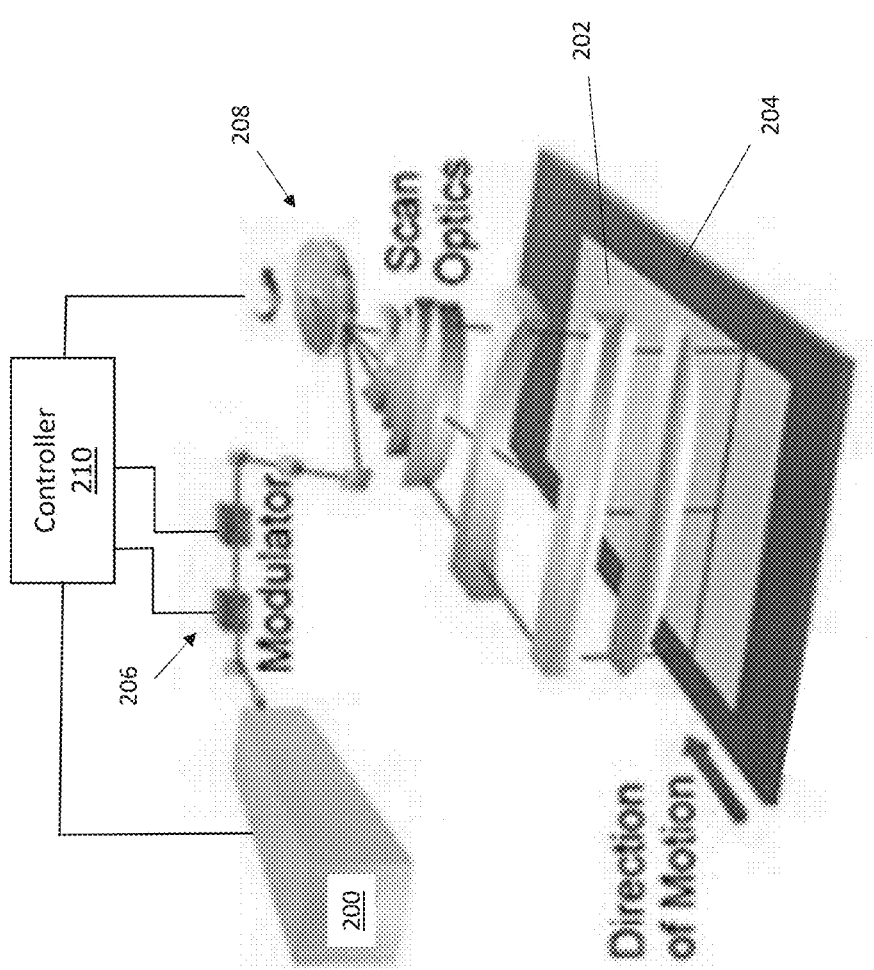
FIG. 3 illustrates an embodiment of a system for manufacturing the RF power package shown in FIGS. 1 and 2.

FIG. 3 illustrates an embodiment of a system for implementing a method of manufacturing the RF power package shown in FIGS. 1 and 2. The system includes an energy source 200 such as a laser for patterning planar tuning lines in the metallized part 202 of a substrate 204. The system further includes a modulator 206 for modulating the energy output by the energy source 200, and in the case of a laser source, scan optics 208 for directing the modulated laser beam toward the metallized surface 202 of the substrate 204 being patterned. As previously explained herein, the substrate 204 can be a ceramic body with a metallized surface, a PCB panel with a laminated copper sheet, an eWLB-type carrier with a laminated foil, etc.

The system also includes a controller 210 for controlling the energy source 200, modulator 206 and optics 208 (in the case of a laser source) so as to pattern the metallized part 202 of the substrate 204 into planar tuning lines. For the RF power package shown in FIGS. 1 and 2, the system patterns a first plurality of planar tuning lines in the metallized part 202 of the substrate 204. The first plurality of planar tuning lines electrically connect the output terminal of an RF power transistor die to an output terminal of the package. The energy source 200, modulator 206 and optics 208 (in the case of a laser source) are controlled so as to shape the first plurality of planar tuning lines in a way such that the first plurality of planar tuning lines transforms the output impedance at the output terminal of the RF power transistor die to a higher target level at the package output terminal. In one embodiment, the first plurality of planar tuning lines is shaped as straight lines because the first plurality of planar tuning lines will be on the output side of the RF power package. However, the first plurality of planar tuning lines can have a different shape if the target application warrants a different configuration for impedance matching/transformation.

As previously explained herein, an output capacitor can be embedded in or subsequently attached to the substrate 204 after patterning. The output capacitor is electrically connected between the output terminal of the die and the package output terminal via the first plurality of planar tuning lines. The first plurality of planar tuning lines, as shaped by the system shown in FIG. 3, together with the output capacitor form an output impedance matching network as previously explained herein in connection with FIGS. 1 and 2.

The system controller 210 also controls the energy source 200, modulator 206 and optics 208 (in the case of a laser source) so as to pattern a second plurality of planar tuning lines in the metallized part 202 of the substrate 204. The second plurality of planar tuning lines electrically connect the input terminal of the RF power transistor to an input terminal of the RF power package via the second plurality of planar tuning lines. The second plurality of planar tuning lines is shaped by the system so as to transform the input impedance at the die input terminal to a different level at the package input terminal. An input capacitor can be embedded in or subsequently attached to the substrate 204 as previously explained herein. The input capacitor is electrically connected between the input terminal of the RF power transistor and the package input terminal via the second plurality of planar tuning lines. The second plurality of planar tuning lines, as shaped by the system shown in FIG. 3, together with the input capacitor form an input impedance matching network. The second plurality of planar tuning lines can be shaped by the system as meandering lines so as transform the input impedance at the die input terminal to a different level at the package input terminal.

The RF power transistor die and input and output capacitors are not shown in FIG. 3, and would be typically added to the RF power package after the metallized part 202 of the substrate 204 is patterned so as to form the planar tuning lines. The input and output capacitors may instead be embedded in the substrate 204, and therefore would be out of view in FIG. 3. In each case, both signal/power routing between packaging components and impedance matching/transformation are provided by appropriate patterning of the metallized part 202 of the substrate 204 into planar tuning lines.

The system controller 210 can adjust its control of the energy source 200, modulator 206 and optics 208 (in the case of a laser source) to account for variations in the manufacturing process. The frequency response of RF matching networks is a complex function of geometry. As the width/spacing of the planar tuning lines varies during the manufacturing process, so too does the mutual impedance and loss of the planar tuning lines. Different line widths may need different correction factors. The thickness of the substrate 204 also effects the mutual impedance and loss of the planar tuning lines.

Figure 4B:
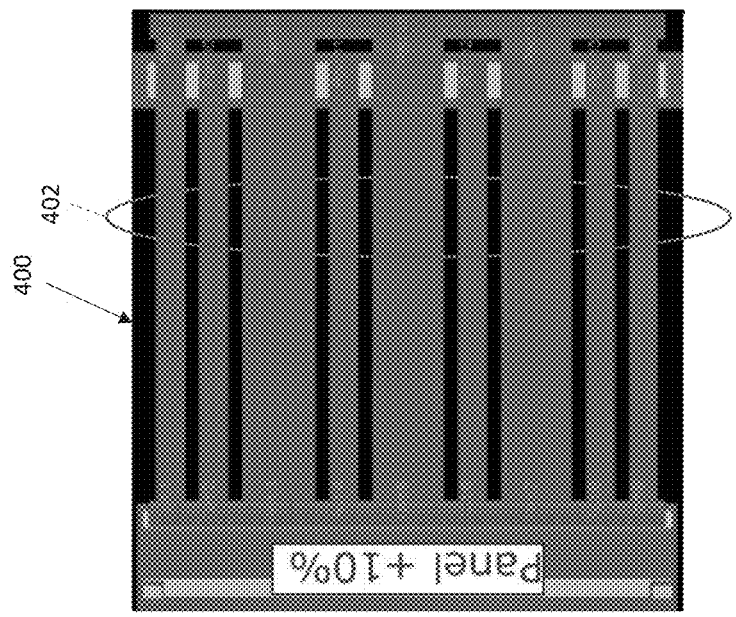
FIG. 4B illustrates a top-down plan view of the same part of another RF power amplifier package having a substrate with +10% variation in thickness, without retuning.
Figure 4A:
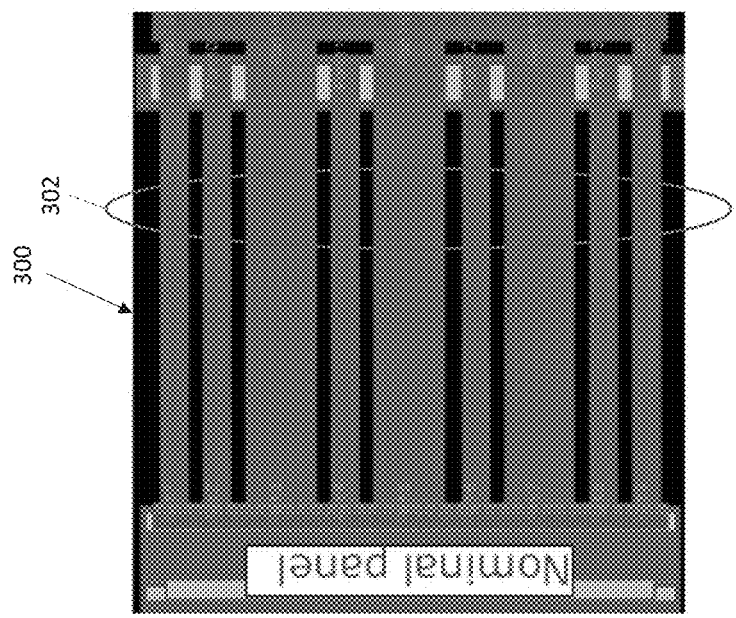
FIG. 4A illustrates a top-down plan view of part of an RF power amplifier package having a substrate with nominal thickness.

FIG. 4A illustrates part of a substrate 300 having a nominal thickness. FIG. 4B illustrates the same part of another substrate 400 having a +10% variation in thickness. The mutual impedance and loss of the planar tuning lines 302 shown in FIG. 4A differs from the mutual impedance and loss of the planar tuning lines 402 shown in FIG. 4B due to the different substrate thicknesses. The system controller 210 can adjust its control of the energy source 200, modulator 206 and optics 208 (in the case of a laser source) so as to account for substrate thickness variation. Without this adaptation, the planar lines 302, 402 would have the same dimensions even though the substrate thicknesses are 10% different. As a result, the RF power packages will not have the same frequency response.

Figure 5B:
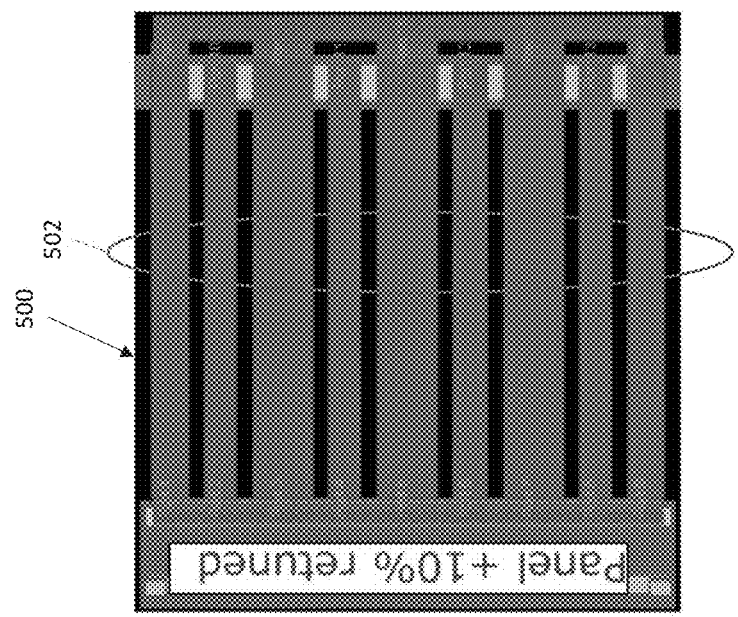
FIG. 5B illustrates a top-down plan view of the same part of another RF power amplifier package having a substrate with +10% variation in thickness, with retuning.
Figure 5A:
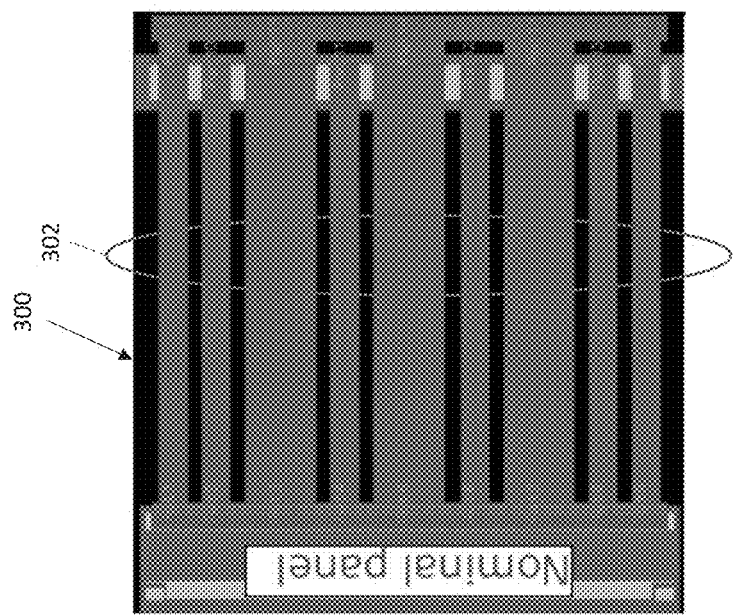
FIG. 5A illustrates a top-down plan view of part of an RF power amplifier package having a substrate with nominal thickness.

FIG. 5A illustrates the same substrate 300 shown in FIG. 4A having a nominal thickness. FIG. 5B illustrates the same part of another substrate 500 having a +10% variation in thickness. Different than the substrate 400 shown in FIG. 4B, the system 210 accounts for the thicker substrate 500 when patterning the planar tuning lines 502 in the metallized part of the (thicker) substrate 500 shown in FIG. 5B. The widths of the planar tuning lines 502 of the RF power package shown in FIG. 5B are different than the widths of the planar tuning lines 302 of the RF power package shown in FIG. 5A. The system controller 210 can also adjust its control of the energy source 200, modulator 206 and optics 208 (in the case of a laser source) to account for thinner than nominal package substrates. This way, RF power packages manufactured using the system described herein have approximately the same frequency response even though substrate thickness may vary, by applying different tuning patterns that account for variations in substrate thickness.

In one embodiment, the system controller 210 determines an initial shape of the planar tuning lines prior to formation based on a nominal thickness specified for the substrate. The planar tuning lines are then formed by determining the difference between the nominal thickness and a measured thickness of the substrate and determining, based on the difference between the nominal thickness and the measured thickness, an amount of adjustment needed to the initial shape so that the input and output impedances are still transformed to the corresponding target levels via the planar tuning lines when formed with the adjusted shape. This may involve widening, narrowing, lengthening, or shortening some or all of the planar tuning lines on the input and/or output side of the RF power package. Any standard approach such as visual inspection can be used for measuring the substrate thickness.

In another embodiment, the system controller 210 determines an initial shape of the planar tuning lines prior to formation based on an expected electrical parameter such as frequency response, impedance, etc. for the RF power transistor die. The system then forms the planar tuning lines by determining the difference between the expected electrical parameter and a corresponding measured electrical parameter of the RF power transistor die and determining, based on the difference between the expected electrical parameter and the measured electrical parameter, an amount of adjustment needed to the initial shape so that the input and output impedance of the RF power package is still transformed to the corresponding target levels via the planar tuning lines when formed with the adjusted shape. Any standard approach such as wafer level or die level testing can be used for measuring electrical parameters of the RF power transistor die.

In the case of Doherty power amplifiers, the system controller 210 can adjust its control of the energy source 200, modulator 206 and optics 208 (in the case of a laser source) to compensate for magnitude/phase/gain etc. variation.

FIG. 6A illustrates part of a Doherty amplifier package that includes main (M) and peaking (P) RF power transistor dies embedded in or attached to a substrate 600 and planar tuning lines formed in a metallized part of the substrate 600. The planar tuning lines are shaped so as to form output matching devices 602, 604 for both RF power transistor dies M, P and an impedance combiner such as a Doherty combiner. The Doherty combiner combines or sums the load currents of the amplifier dies M, P at a summing node so that the output voltage of the Doherty amplifier circuit is determined by the summation of the load currents multiplied by the load impedance. To this end, the Doherty combiner has a first impedance Z1 which couples the output of the main amplifier M to the summing node. The output of the peaking amplifier P is also coupled to the summing node. A second impedance Z2 of the Doherty combiner couples the summing node to the package output terminal 606. The first impedance Z1 of the Doherty combiner is implemented as a ¼ wave transmission line 608 that phase aligns the signal outputs of the RF power transistor dies M, P such that the signal outputs are reactively combined at a first impedance level which is above the output impedance of the RF power transistor dies. The second impedance Z2 of the Doherty combiner is implemented as a ¼ wave transmission line 610 that increases the impedance of the signal outputs to a second impedance level greater than the first impedance level at the package output terminal 606.

Additional planar tuning lines are formed in the metallized part of the substrate 600 for providing both signal/power routing and impedance matching/transformation on the input side of the Doherty amplifier package, but are not shown in FIGS. 6A and 6B for ease of illustration. These planar tuning lines can be shaped as needed e.g. as meandering lines so as to provide the desired impedance matching/transformation characteristic on the input side of the package.

FIG. 6B illustrates the same part of another Doherty amplifier package, but which has a substrate 700 with a +10% variation in thickness. The system controller 210 accounts for the thicker substrate when patterning the planar tuning lines in the metallized part of the (thicker) substrate 700 shown in FIG. 6B. As a result, the widths of the planar tuning lines 702, 704, 708, 710 of the Doherty amplifier package shown in FIG. 6B are different than the widths of the planar tuning lines 602, 604, 608, 610 of the Doherty amplifier package shown in FIG. 6A. The system controller 210 also can adjust its control of the energy source 200, modulator 206 and optics 208 (in the case of a laser source) to account for thinner than nominal package substrates. This way, Doherty amplifier packages manufactured using the system described herein have approximately the same magnitude/phase/gain response even though substrate thickness may vary, by applying different tuning patterns that account for variations in substrate thickness.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An RF power package, comprising:
a substrate having a metallized part and an insulating part;
an RF power transistor die embedded in or attached to the substrate, the RF power transistor die having a die input terminal, a die output terminal, an input impedance and an output impedance;
a package input terminal formed in the metallized part or attached to the insulating part of the substrate;
a package output terminal formed in the metallized part or attached to the insulating part of the substrate; and
a first plurality of uninterrupted planar tuning lines formed in the metallized part of the substrate and directly electrically connecting the die output terminal to the package output terminal without intervening bond wires,
wherein the first plurality of uninterrupted planar tuning lines is shaped so as to transform the output impedance at the die output terminal to a higher target level at the package output terminal.

2. The RF power package of claim 1, further comprising:
a second plurality of uninterrupted planar tuning lines formed in the metallized part of the substrate and directly electrically connecting the die input terminal to the package input terminal without intervening bond wires,
wherein the second plurality of uninterrupted planar tuning lines is shaped so as to transform the input impedance at the die input terminal to a different level at the package input terminal.

3. The RF power package of claim 2, further comprising:
a capacitor embedded in or attached to the substrate and electrically connected between the die input terminal and the package input terminal,
wherein the second plurality of uninterrupted planar tuning lines and the second capacitor form an input impedance matching network.

4. The RF power package of claim 2, wherein the second plurality of uninterrupted planar tuning lines is formed in meandering lines.

5. The RF power package of claim 1, wherein the substrate comprises a ceramic body and a patterned metallization applied to the ceramic body, and wherein the patterned metallization forms the metallized part of the substrate.

6. The RF power package of claim 1, wherein the substrate is a printed circuit board comprising conductive tracks patterned into one or more copper sheets laminated onto a non-conductive body, and wherein the conductive tracks and the one or more copper sheets form the metallized part of the substrate.

7. The RF power package of claim 1, wherein the substrate comprises a first insulating material in which the RF power transistor die is embedded, a second insulating material covering the first insulating material and the RF power transistor die, and one or more metal redistribution layers disposed in the second insulating material, wherein each metal redistribution layer is electrically connected to die input terminal and/or die output terminal through openings in the second insulating material, and wherein the one or more metal redistribution layers form the metallized part of the substrate.

8. The RF power package of claim 1, wherein the first plurality of uninterrupted planar tuning lines is formed in straight lines.

9. The RF power package of claim 1, further comprising:
a capacitor embedded in or attached to the substrate and electrically connected between the die output terminal and the package output terminal, wherein the first plurality of uninterrupted planar tuning lines and the capacitor form an output impedance matching network.

10. The RF power package of claim 1, further comprising:
an additional RF power transistor die embedded in or attached to the substrate, the additional RF power transistor die having a die input terminal, a die output terminal, an input impedance and an output impedance,
wherein the RE power transistor die is a main amplifier of a Doherty amplifier circuit,
wherein the additional RF power transistor die is a peaking amplifier of the Doherty amplifier circuit,
wherein the first plurality of uninterrupted planar tuning lines is shaped so as to form a first ¼ wave transmission line for phase aligning signal outputs of the RF power transistor dies such that the signal outputs are reactively combined at a first impedance level which is above the output impedance of the RF power transistor dies, and so as to form a second ¼ wave transmission line for increasing the impedance of the signal outputs to a second impedance level greater than the first impedance level at the package output terminal.

11. A method of manufacturing an RF power package, the method comprising:
embedding or attaching an RF power transistor die to a substrate having a metallized part and an insulating part, the RF power transistor die having a die input terminal, a die output terminal, an input impedance and an output impedance; and
forming a first plurality of uninterrupted planar tuning lines in the metallized part of the substrate, the first plurality of uninterrupted planar tuning lines directly electrically connecting the die output terminal to a package output terminal formed in the metallized part or attached to the insulating part of the substrate without intervening bond wires,
wherein forming the first plurality of uninterrupted planar tuning lines comprises shaping the first plurality of uninterrupted planar tuning lines so that the first plurality of uninterrupted planar tuning lines transforms the output impedance at the die output terminal to a higher target level at the package output terminal.

12. The method of claim 11, further comprising:
forming a second plurality of uninterrupted planar tuning lines in the metallized part of the substrate; and
directly electrically connecting the die input terminal to a package input terminal formed in the metallized part or attached to the insulating part of the substrate via the second plurality of uninterrupted planar tuning lines without intervening bond wires,
wherein the second plurality of uninterrupted planar tuning lines is shaped so as to transform the input impedance at the die input terminal to a different level at the package input terminal.

13. The method of claim 12, further comprising:
embedding or attaching a capacitor to the substrate; and
electrically connecting the capacitor between the die input terminal and the package input terminal via the second plurality of uninterrupted planar tuning lines,
wherein the second plurality of uninterrupted planar tuning lines and the second capacitor form an input impedance matching network.

14. The method of claim 12, wherein shaping the second plurality of uninterrupted planar tuning lines so as transform the input impedance at the die input terminal to a different level at the package input terminal comprises shaping the second plurality of uninterrupted planar tuning lines as meandering lines.

15. The method of claim 11, wherein shaping the first plurality of uninterrupted planar tuning lines so as to transform the output impedance at the die output terminal to the higher target level at the package output terminal comprises shaping the first plurality of uninterrupted planar tuning lines as straight lines.

16. The method of claim 11, further comprising:
embedding or attaching a capacitor to the substrate; and
electrically connecting the capacitor between the die output terminal and the package output terminal via the first plurality of uninterrupted planar tuning lines,
wherein the first plurality of uninterrupted planar tuning lines and the capacitor form an output impedance matching network.

17. The method of claim 11, further comprising:
embedding or attaching an additional RF power transistor die to the substrate, the additional RF power transistor die having a die input terminal, a die output terminal, an input impedance and an output impedance,
wherein the RF power transistor die is a main amplifier of a Doherty amplifier circuit,
wherein the additional RF power transistor die is a peaking amplifier of the Doherty amplifier circuit,
wherein shaping the first plurality of uninterrupted planar tuning lines so as transform the output impedance at the die output terminal to the higher target level at the package output terminal comprises shaping the first plurality of uninterrupted planar tuning lines so as to form a first ¼ wave transmission line for phase aligning signal outputs of the RF power transistor dies such that the signal outputs are reactively combined at a first impedance level which is above the output impedance of the RF power transistor dies, and so as to form a second ¼ wave transmission line for increasing the impedance of the signal outputs to second impedance level greater than the first impedance level at the package output terminal.

18. The method of claim 11, wherein an initial shape of the first plurality of uninterrupted planar tuning lines is determined prior to formation based on a nominal thickness specified for the substrate, and wherein forming the first plurality of uninterrupted planar tuning lines comprises:
determining the difference between the nominal thickness and a measured thickness of the substrate; and
determining, based on the difference between the nominal thickness and the measured thickness, an amount of adjustment needed to the initial shape so that the output impedance at the die output terminal is still transformed to the higher target level at the package output terminal via the first plurality of uninterrupted planar tuning lines when formed with the adjusted shape.

19. The method of claim 11, wherein an initial shape of the first plurality of uninterrupted planar tuning lines is determined prior to formation based on an expected electrical parameter for the RF power transistor die, and wherein forming the first plurality of uninterrupted planar tuning lines comprises:
determining the difference between the expected electrical parameter and a measured electrical parameter of the RF power transistor die; and
determining, based on the difference between the expected electrical parameter and the measured electrical parameter, an amount of adjustment needed to the initial shape so that the output impedance at the die output terminal is still transformed to the higher target level at the package output terminal via the first plurality of uninterrupted planar tuning lines when formed with the adjusted shape.

* * * * *

UNITED STATES PATENT AND TRADEMARK OFFICE
CERTIFICATE OF CORRECTION

PATENT NO. : 10,978,411 B2
APPLICATION NO. : 15/355498
DATED : April 13, 2021
INVENTOR(S) : M. Simcoe Page 1 of 1

It is certified that error appears in the above-identified patent and that said Letters Patent is hereby corrected as shown below:

In the Claims

Column 10, Line 28 (Claim 17, Line 11) please change "so as transform" to -- so as to transform --

Column 10, Line 38 (Claim 17, Line 21) please change "to second" to -- to a second --

Signed and Sealed this
Thirty-first Day of August, 2021

Drew Hirshfeld
*Performing the Functions and Duties of the*
*Under Secretary of Commerce for Intellectual Property and*
*Director of the United States Patent and Trademark Office*